United States Patent [19]

Yamamura

[11] Patent Number: 5,293,005
[45] Date of Patent: Mar. 8, 1994

[54] ELECTRONIC DEVICE HAVING HIGH-DENSITY WIRING

[75] Inventor: Hideho Yamamura, Yokohama, Japan

[73] Assignee: Hitachi, Ltd., Tokyo, Japan

[21] Appl. No.: 953,967

[22] Filed: Sep. 29, 1992

[30] Foreign Application Priority Data

Sep. 30, 1991 [JP] Japan .................. 3-250898

[51] Int. Cl.$^5$ ............................................. H05K 1/00
[52] U.S. Cl. ......................... 174/251; 174/128.1; 174/262; 361/792
[58] Field of Search ................ 174/251, 128.1, 262, 174/263, 264, 265, 266; 361/412, 414, 428

[56] References Cited

U.S. PATENT DOCUMENTS 4,811,082  3/1989  Jacobs et al.

OTHER PUBLICATIONS

"High-Density Surface Mounting Technique" Triceps Corporation, Apr. 20, 1987, pp. 73, 126–128.

"CAE of Printed Board", Applied Technique Publishing Corporation, pp. 4–5, 58–59, 76.

*Primary Examiner*—Leo P. Picard
*Assistant Examiner*—Cheryl R. Figlin
*Attorney, Agent, or Firm*—Antonelli, Terry, Stout & Kraus

[57] ABSTRACT

An electronic device having high density wiring formed in a multi-level layer structure which has a plurality of conductors distributed with high density. Each conductor is formed to have a sectional area which is determined on the basis of length thereof such that ones of the plurality of conductors having relatively longer lengths have sectional areas larger than those ones of relatively shorter lengths. Wirings in the electronic device are formed through effecting electrical connections of conductors having step-wise increasing sectional areas to thereby control the wiring resistance and signal propagation delay thereof and also preclude a malfunction or reduction in operation performance of the device.

20 Claims, 7 Drawing Sheets

FIG. I
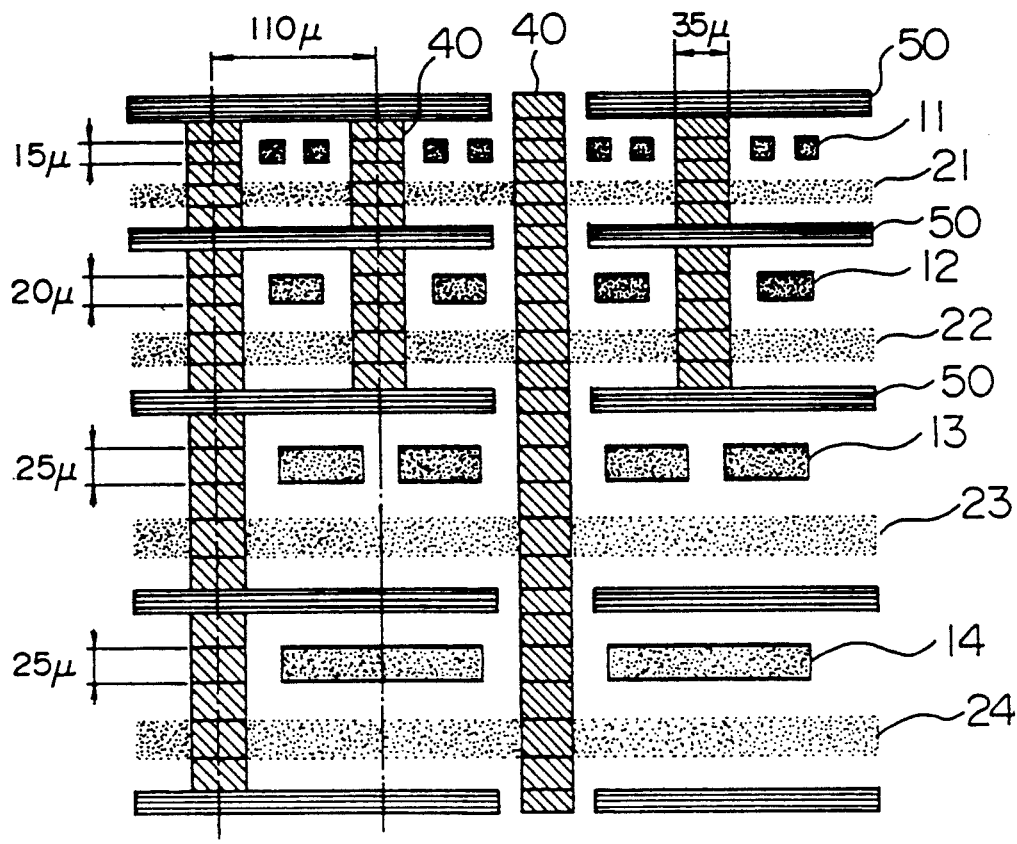
FIG. 2
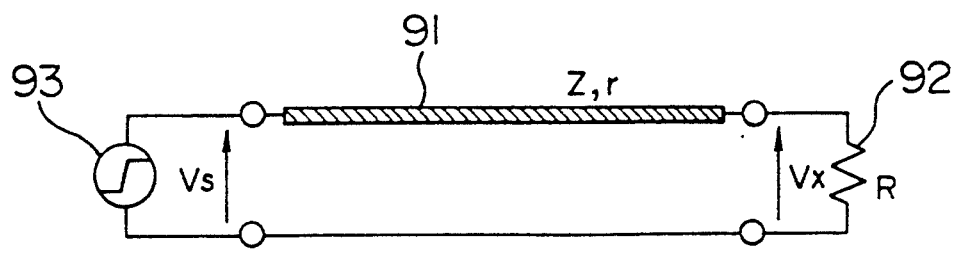

ELECTRONIC DEVICE HAVING HIGH-DENSITY WIRING

BACKGROUND OF THE INVENTION

The present invention relates to an electronic device having high-density wiring, and more particularly to an electronic device having high-density wiring in which the shape or configuration of wiring in a digital electronic device is dealt with.

As advances in electronic devices are developed, emphasis towards further miniaturization, complexity and large scale integration schemes will become more prevalent as the demands for high function and high performance become increased, thereby facilitating use of and portability of the electronic device. Employing a high-density wiring technique greatly contributes to attainment of these objectives.

Wiring in the electronic device is mainly formed on a printed wiring board, a ceramic board, a semiconductor or the like, and in either case, the wiring is usually designed on the condition that the configuration thereof, such as width and thickness of a conductor, for use in wiring, is fixed, except for the length of the conductor thereof. Particularly, the number of conductors for use in wiring for transmitting signals is increased and, accordingly, it is common that the above condition is strictly kept since the design of wiring is simplified by using this condition.

When the width and thickness of a conductor, used in wiring, are standardized to be fixed and conductors are positioned on grids arranged at regular intervals, the design of wiring can be made simply and rapidly by dividing the design into designs relative to paths and shape of conductors. More particularly, the path design can be made only by considering how conductors can be connected between terminals through predetermined paths on the grids without intersection with many other conductors. The shape design can be made only by applying a width of conductors, a shape of connection terminals and a shape of through-holes and the like to the result of the path design to design actual shape of conductors. A final wiring configuration is described on a mask which is subjected to a process technique, such as the photolithography and the etching technique, to form actual wiring.

Such a wiring design method is known widely and can be found in, for example, "HIGH-DENSITY SURFACE MOUNTING TECHNIQUE", TRICEPS Corporation, ISBN 4-88657511, pages 73 and 126–128, and "CAE OF PRINTED BOARD" by Akihiko Yamada, Applied Technique Publishing Corporation, pages 4–5, 58–59 and 76.

As described above, by standardizing to make the width and thickness of conductors fixed and dividing the wiring design into two steps of the path design and the shape design, the design work of wiring can be arranged to be concise and be made rapidly or a large-scale design can be achieved to contribute to the development of the electronic industry greatly.

An electronic device can be complicated, formed on a large scale and miniaturized and hence possess increased functions and high performance by high-density wiring. More particularly, there is technical development of the process which can form a wiring configuration for conductors and through-holes with high density, so that wiring can be made narrower and thinner and the mounting density can be improved to attain miniaturization, enhanced circuit complexity, large-scale formation and high function of the electronic device. Further, since miniaturization of the device can shorten the length of wiring, a time required for propagating a signal through wiring is reduced so that the device is operated at high speed to thereby improve the performance of the device.

In the device design using the high-density wiring, particularly the wiring design, the dimension of wiring is standardized to be narrowed and thinned to a minimum attained by the high-density wiring technique. Consequently, the dimension of wiring is reduced uniformly. This method advantageously reduces the wiring dimension of the device and hence the mounting density uniformly over the whole device to utilize the benefit of the high-density wiring technique effectively.

As described above, in the prior art, the dimension such as the width and thickness of conductors is designed in accordance with the predetermined standards and the high-density wiring is attained by reduction of the standardized dimension to thereby realize miniaturization circuit complexity, large-scale formation, high function and high performance of the electronic device.

However, any attempt at further advancement using the above conventional wiring method would reach an electrical limit, so that the normal operation of the electronic circuit is impeded. This is caused by the fact that narrowed and thinned wiring configuration with high density reduces a sectional area of conductors and increases an electrical resistance of conductors. More particularly, when the conventional wiring method is used to narrow and thin the width and thickness of conductors, a resistance of conductors is increased and the electronic device can no longer be operated normally or the performance of the device is reduced. It would not be practical to solve this problem by improvement of material since a material having a considerably small resistivity as compared with copper or aluminum is not available and since the superconductor wiring cannot be easily utilized. Further, in the conventional wiring design technique, since the dimension, such as the width and thickness of conductors, is standardized to be fixed, malfunction of the electronic device and reduction of performance thereof are caused by employing many long conductors.

SUMMARY OF THE INVENTION

It is an object of the present invention to provide an electronic device having high-density wiring which realizes miniaturization and high function and high performance by means of a structure capable of attaining high-density wiring while preventing any adverse affect on the performance of an electronic circuit.

According to the present invention, the dimension , such as the width and thickness of wiring, is not standardized to be fixed and is varied in accordance with a length of wiring to thereby solve the problem of the increased resistance of wiring.

More particularly, since a resistance of wiring is small when a length of wiring is short and a resistance is large when a length of wiring is long, a sectional area of wiring is controlled so that a resistance of wiring is equal to a desired resistance value to thereby attain high-density wiring while keeping the normal operation of the device and improving the performance thereof.

BRIEF DESCRIPTION OF THE DRAWINGS

FIG. 1 is a partially sectional view of a thin-film multi-layer substrate or board schematically illustrating a first embodiment of the present invention;

FIG. 2 is a schematic diagram illustrating a wiring circuit at a reception termination (or receiving end) using a transmission line;

DESCRIPTION OF THE EMBODIMENTS

Figure 3:
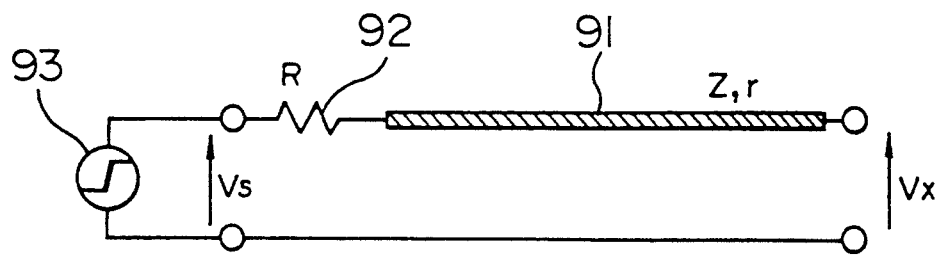
FIG. 3 is a schematic diagram illustrating a wiring circuit at a transmission termination (or transmitting end) using a transmission line.

The principle of the present invention will first be described.

As a first form of the high-density wiring, there is a case in which wiring in a device, having the circuit scale of the same degree, is narrowed and thinned with high density to reduce the external dimension of the whole device, that is, effect in a miniaturization of the device. In this case, the width, thickness and length of wiring are reduced substantially uniformly. When the high-density wiring is made to the utmost, the high-density wiring can be continued until the width of wiring is substantially equal to the thickness thereof. That is, since it is very difficult to manufacture wiring having a vertically long structure or a cross sectional shape having an aspect ratio of greater than one, for example, in which the width of wiring is narrower than the thickness thereof, the width and thickness of wiring are finally reduced uniformly. Further, if the width of wiring is reduced to improve the density of wiring and electronic circuit elements are also made small in parallel therewith, the required length of wiring is also made short. In this manner, in the case of the miniaturization of the device, it is proper to consider a model in which the width, thickness and length of wiring are reduced uniformly.

As a second form of the high-density wiring, there is a case in which wiring is narrowed and thinned with high density while the circuit scale accommodated in the device is increased and the external dimension of the whole device remains to the same degree, that is, increases as to the number of functions. In this case, since the dimension of the whole device is not changed, a distance between electronic circuits disposed at opposite ends of the device is not changed and the maximum length of wiring is not changed. That is, it is proper to consider a model in which the width and thickness of wiring are reduced uniformly and the length of wiring is fixed.

An electrical resistance R of wiring is calculated from a sectional area S, a length L and a resistivity $\rho$ material in accordance with the equation of $R = \rho L/S$, while if there is considered an example of miniaturizing the device on condition that a width w, a thickness t and a length L of wiring are reduced to one k-th (1/k) uniformly, a resistance of wiring is increased to k times since a sectional area is $S = wt$ which is a second power and the length L is a first power. Accordingly, the resistance of wiring is increased in proportion to the degree of high-density wiring.

In the case where functions of the device are increased, if the width w and thickness t of wiring are reduced to one k-th (1/k), a sectional area is reduced to one over k squared ($1/k^2$) and since the length L is not changed, a resistance of wiring is rapidly increased to $k^2$ times with high density of wiring.

Thus, when wiring is made narrower and thinner with high density, a resistance of wiring is increased in proportion to the degree of high density or with a degree larger than the degree of high density. The resistance value can be derived in detail from the Rent's Rule relative to the number of gates and the number of conductors in a digital circuit and its resultant value is also between the first power and the second power of the degree of high density. Further, there is a possibility that the resistance value of wiring is increased to the first power or less or the second power or more of the degree of high density depending on circuits and devices, while the tendency of increasing the resistance of wiring with the high density of wiring is an inevitable physical factor in view of reduction of the sectional area.

When an electrical resistance of wiring is increased, normal operation of an electronic circuit is impeded.

In a high-speed electronic circuit, a transmission line is used for wiring. The transmission line is used when a speed of signal wave, more particularly, a rise time from the standpoint of a digital wave cannot be neglected as compared with a propagation delay time in wiring or is substantially equal to or larger than the propagation delay time. The transmission line is terminated with a terminating resistance to prevent a signal from being reflected at an end of the transmission line and being distorted. The terminating resistance has the same resistance value as a characteristic impedance of the transmission line to absorb a signal waveform without reflection. There are two methods of connecting the terminating resistance, that is, a first method of connecting the terminating resistance to a signal transmitting side named a so-called source termination and a second method of connecting the terminating resistance to a signal arrival point named a so-called a reception termination.

In the case of the reception termination, a circuit for wiring is as shown in FIG. 2. In FIG. 2, numeral 91 denotes a transmission line, 92 a terminating resistance, 93 a signal voltage source, Vs an input voltage, and Vx an output voltage. When the characteristic impedance of wiring or transmission line is Z, a value of the terminating resistance is R, and a resistance value of wiring is r, $R=Z$ for the unreflected termination and a relation of the input voltage Vs and the output voltage Vx of wiring is $Vx=Vs \times Z/(Z+r)$. If it is assumed that the resistance value r of wiring is negligibly small, $Vx=Vs$, that is, the input voltage is equal to the output voltage which is a normal output voltage. If it is assumed that the resistance value r of wiring is equal to the characteristic impedance Z of the transmission line or the terminating resistance value R, $Vx=Vs/2$, that is, the output voltage is a half of the input voltage Vs. In other words, the output voltage is a half of a normal value. A digital circuit operates to input and output a binary signal having a high voltage $V_H$ and a low voltage $V_L$, while when an input signal voltage is an intermediate voltage, the digital circuit cannot identify the binary signal and proper operation of the circuit fails. The condition that the output voltage is a half of the normal value corresponds to the failed condition and, therefore, operation of the electronic circuit applied with this signal would fail. An actual operation of a circuit fails normally before the input voltage is reduced to a half and is further influenced by noise. Accordingly, the voltage drop of about 5 to 30% due to the wiring resistance becomes a problem. This is named lack of noise margin.

A circuit for wiring in the case of the source termination is shown in FIG. 3. In FIG. 3, numeral 91 denotes a transmission line, 92 a terminating resistance at the transmission end, 93 a signal voltage source, Vs an input voltage, and Vx an output voltage. When a resistance of wiring is large, a transmitted signal voltage changes with the elapse of time to reach a normal value finally, although initially the signal follows a course different from the normal value. When the signal reaches an arrival end in the first place, the output voltage Vx is $Vx=Vs \times Z/(Z+r)$ in quite the same manner as in the reception termination. When the resistance r of wiring is equal to the characteristic impedance Z of the transmission line or the terminating resistance value R, the output voltage Vx is $Vx=Vs/2$ which is a half of the normal value. The electronic circuit applied with this signal does not operate properly. In the case of the source termination, the reception end is open and reflection occurs, while the output voltage approaches that of the normal value while producing a stepwise waveform each time the signal is repeatedly reflected at both ends of the transmission line. Finally, the output voltage becomes the normal value but it takes time. More particularly, when a time required to propagate a signal on one way of wiring is $t_{pd}$, a time required for an input signal to first reach an output point is $t_{pd}$. A time required for a reflected wave at the output point to return to the input point and reach the output point again is $2t_{pd}$ which accounts for the forward and reflecting signal directions. Accordingly, the output voltage changes stepwise at times of $t_{pd}$, $3t_{pd}$, $5t_{pd}$, $7t_{pd}$ and the like starting from the time of initially sending the signal and becomes a stepwise waveform to approach to the normal value. Thus, when the normal voltage is not obtained at the first time $t_{pd}$, the voltage sufficient to operate an electronic circuit applied with this signal is obtained at time $3t_{pd}$ or $5t_{pd}$ or thereafter. When the resistance of wiring is sufficiently small, the normal value is obtained at time $t_{pd}$, whereas when the resistance of wiring is large, it takes time, for example, at least three times as compared with the case for the small resistance of wiring. In a high-speed circuit using the transmission line for wiring, the time required for propagation on wiring is not neglected and important. Accordingly, the propagation delay time reaching three times has the effect of or five times reduction the operating performance of the device. Further, in an actual circuit, if a digital electronic circuit is applied with a voltage which becomes a half of the normal value in a time section from the time $t_{pd}$ to $3t_{pd}$ as described above, the electronic circuit cannot discern whether binary value is of a high voltage $V_H$ of a low voltage $V_L$ and its proper operation is failed only in this time section, so that there is a case where operation of the device is adversely affected. When reduction in the output voltage is as small as about 5 to 30%, a problem of lack of noise margin occurs in the same manner as in the reception termination.

When a transmission line is not used as wiring and a resistance of wiring is high, a propagation time of signal in wiring is increased and performance of an electronic circuit is impeded. Wiring which do not use a transmission line can be defined as wiring having no terminating resistance. Generally, wiring includes a wiring resistance r and a wiring capacitance C and a time constant $\tau=rC$ of wiring is formed by both of the resistance and the capacitance. The time constant $\tau$ influences the propagation speed. When a rise time of a signal applied to wiring is tr, a rise time tr' at an output point of wiring is $tr'=(tr^2+\tau^2)^{\frac{1}{2}}$. If the time constant $\tau$ is 0, $tr'=tr$, while if the time constant $\tau$ of wiring is substantially equal to or larger than the rise time tr of the signal applied to wiring (if $tr=\tau$, $tr'=1.4$ tr), the rise time tr' at the output point of wiring is 1.4 times or more of the rise time tr of the signal inputted to wiring and is obviously slow. When the time constant $\mu$ of wiring is further increased, the rise time tr' at the output point is substantially equal to the time constant $\tau$ of wiring by disregarding the term $tr^2$ in the square root and is increased in proportion to an increase of the time constant. A rise time is generally represented by a transition time from 10% to 90% or from 20% to 80% of a voltage amplitude of a signal. A time required for a signal to pass through wiring, that is, a propagation delay time $t_{pd}$, is generally represented by a difference of time between that reaching 50% of or midway of the input signal with that of the output signal. Accordingly, in the above case, a half of a difference of the rise time tr of the input signal to wiring and the rise time tr' at the output point of wiring is the time required for the signal to pass through wiring, that is, the propagation delay time $t_{pd}$. Its equation is $t_{pd}=(tr'-tr)/2$. When the time constant $\tau$ of wiring is increased to the rise time tr or more of the input signal, the propagation delay time $t_{pd}$ of wiring cannot be neglected as compared with the rise time tr of the signal and is increased substantially in proportion to the time constant $\tau$ of wiring. When it is assumed that the time constant $\tau$ of wiring is equal to the rise time tr of the signal (that is, $\tau=tr$), $t_{pd}=0.2$ tr because $tr'=1.4$ tr and the propagation delay time $t_{pd}$ of wiring cannot be neglected as compared with the rise time tr of the signal. This means that the propagation delay time $t_{pd}$ of wiring cannot be neglected as compared with an operation speed of an electronic circuit since an operation speed or a propagation delay time of elements of an electronic circuit, for example, a gate circuit, is substantially equal to the rise time of the circuit. Accordingly, when the time constant $\tau$ of wiring is increased, performance of a device, particularly in its operation speed, is influenced. Further, when the time constant $\tau$ of wiring is larger than the rise time tr of a signal, the propagation delay time $t_{pd}$ is substantially proportional to the time constant $\tau$ of wiring to thereby reduce performance of the device, particularly in its operation speed.

As described above, a resistance of wiring is increased as wiring is made narrower and thinner with high density. A wiring capacitance is formed between one conductor for wiring and another conductor or in many case, with a ground conductor disposed near the referred to one conductor, which constitute two electrodes of the capacitance. The capacitance C is calculated by $C=\epsilon S/d$ where $\epsilon$ represents a dielectric constant of material interposed between the electrodes, S represents an area of the electrode, and d represents a distance between the electrodes.

When a width, a thickness and a length of wiring are w, t and L, respectively, S=wL and accordingly $C=\epsilon wL/d$. When the width w and the length L of wiring and the distance d between the electrodes are uniformly reduced to 1/k so that the device is made small, the capacitance is reduced to 1/k, while when functions incorporated into the device are increased in which the width w of wiring and the distance d between the electrodes are reduced to 1/k and the length L remains fixed, the capacitance is fixed. In a general manufacturing process, when a width and thickness of metal conductor, used for wiring, are made narrower and thinner with high density, it is natural that the distance d between the electrodes is made thinner similarly and it is technically difficult to realize another form. As described above, even when wiring is made narrower and thinner with high density, it is common that a maximum length of wiring remains substantially unchanged. Accordingly, even when wiring is made narrower and thinner with high density, the capacitance of wiring having the maximum length remains substantially the same.

Variation of the time constant $\tau=rC$ of wiring is considered by combining the variation of the wiring capacitance C with the variation of the wiring resistance r. When the width w and the length L of wiring and the distance d between the electrodes are reduced uniformly so that the device is made small, the capacitance is reduced to 1/k and the wiring resistance is increased k times. Accordingly, the time constant is substantially fixed and the propagation delay time of wiring is not improved although wiring is made narrower and thinner with high density. Further, when functions incorporated into the device are increased in which the width w of wiring and the distance d between the electrodes are reduced to 1/k and the length L remains fixed, the capacitance is fixed and the wiring resistance is increased $k^2$ times. Accordingly, the time constant is increased $k^2$ and the propagation delay time of wiring is increased rapidly.

In this manner, when wiring is made narrower and thinner with high density, performance of the electronic device, particularly in its operation speed, is reduced, i.e. the performance of the electronic device cannot be improved because of an increase of the wiring resistance r.

Embodiments of the present invention are now described on the basis of the principle of the present invention described above in contradistinction to the prior art.

Figure 4:
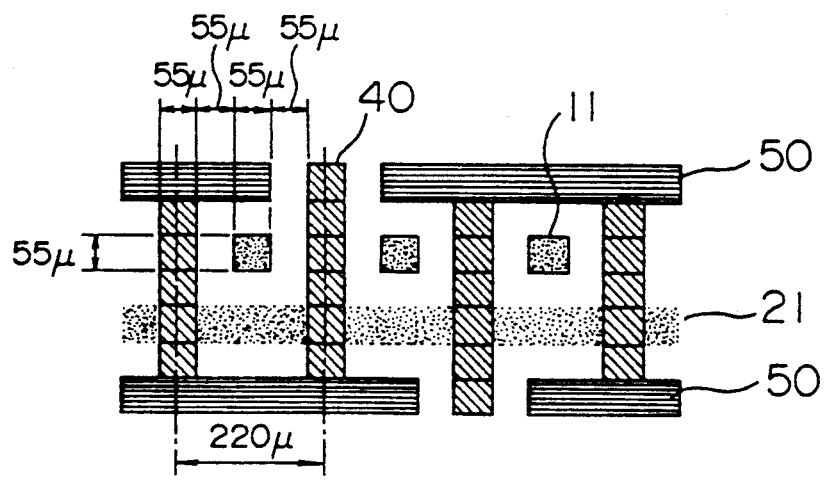
FIG. 4 is a sectional view schematically illustrating wiring in a first prior art.

FIG. 4 schematically illustrates a first prior art of wiring in the form of transmission line formed on a ceramic multi-layer wiring board having a plane dimension of 30 cm square by means of the thin film multi-layer wiring technique. In FIG. 4, numeral 11 denotes signal conductors extending in the Y direction and a section of which is shown in FIG. 4, and numeral 21 denotes a signal conductor extending in the X direction. These signal conductors are interposed between ground layers 50 to form a transmission line. A through-hole 40 is provided to connect conductors vertically. Material of wiring is copper, a resistivity $\rho$ is 2.5 $\mu\Omega$cm, and a characteristic impedance of the transmission line is 50 $\Omega$. Electronic circuits fail because of the relation of the circuits and noise if a wiring resistance is not smaller than 5 $\Omega$. The maximum wiring length required for this wiring board is 60 cm for connecting electronic circuits disposed at diagonal ends through lateral and longitudinal intersecting paths.

When a resistance of a conductor having a length L=60 cm is 5 $\Omega$, a sectional area of the conductor is 3000 square $\mu$m from equation $R=\rho L/S$ for such a wiring resistance. If it is assumed that the conductor is formed to have a square section having the same width and thickness by the wiring forming technique, the width and the thickness of the conductor are about 55 $\mu$m. In the prior art, since this dimension is applied to all wiring in common, even if a new processing technique for making the conductor narrower and thinner with high density is developed, this technique cannot be utilized. If this technique is utilized, a resistance of wiring is very large and the electronic circuit would thereby fail.

Figure 5:
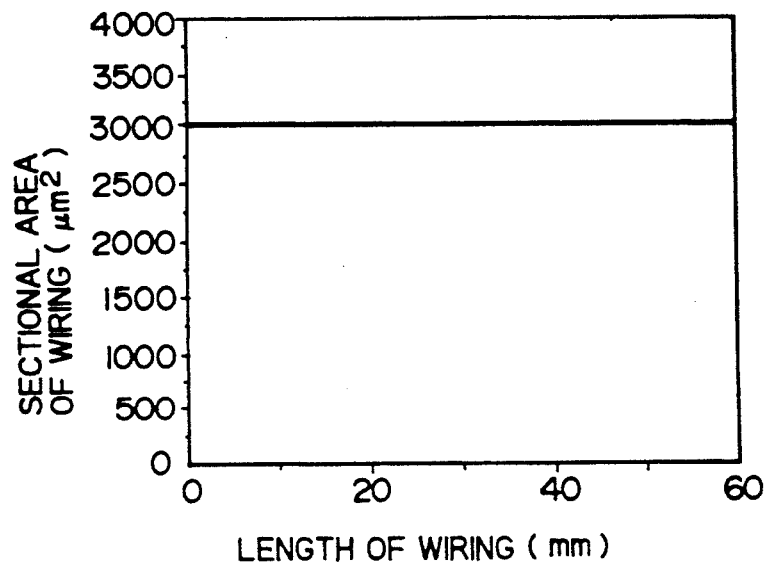
FIG. 5 is a graph showing a relation of a length and a sectional area of the wiring in the prior art shown in FIG. 4.
Figure 6:
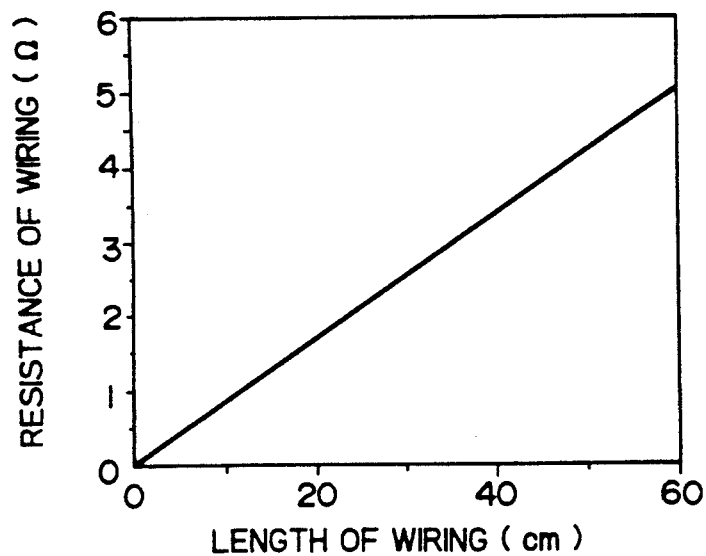
FIG. 6 is a graph showing a relation of a length and a resistance of the wiring in the prior art shown in FIG. 4.

In the conventional structure, a sectional area of wiring is fixed regardless of a length of wiring. A relation of a length and a sectional area of wiring is shown in FIG. 5. Further, a resistance of wiring is proportional to a length of wiring. A relation of the length and the resistance of wiring is shown in FIG. 6.

If it is assumed that a thin film multi-layer printed board is designed on the condition of having a width 55 $\mu$m of a conductor for wiring, a distance 55 $\mu$m between the conductor and an adjacent metal and a diameter 55 $\mu$m of a through-hole for electrically connecting the conductor to other wiring layer, a space between adjacent through-holes is 220 $\mu$m and 1363 (30 cm/220 $\mu$m) wiring positions, so-called channels can be obtained across a distance of 30 cm. 10904 channels in total can be obtained for eight wiring layers, for example, because of 1363 channels per wiring layer. A method in which a single conductor is disposed between adjacent through-holes is a so-called single-channel structure.

If it is assumed that a two-channel structure is adopted, that is, if it is assumed that two conductors are arranged between adjacent through-holes, a space between the through-holes is 330 $\mu$m and 14545 channels in total are obtained for eight wiring layers because of 1818 channels per wiring layer.

In the prior art, the above dimension is applied to all wiring in common and accordingly even if a new processing technique for making wiring narrower and thinner with high density is developed, the density of wiring cannot be increased and the number of channels also cannot be increased.

Figure 7:
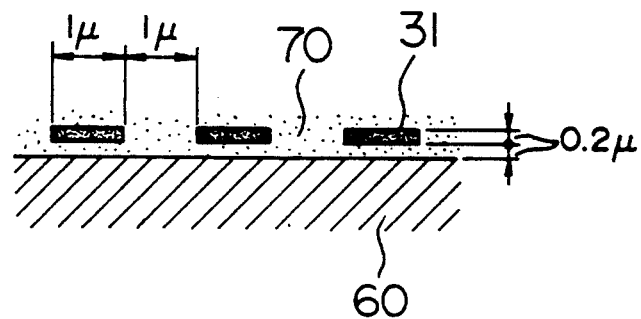
FIG. 7 is a sectional view schematically illustrating wiring in a second prior art.

FIG. 7 is a sectional view of a second prior art showing conductors formed on a semiconductor having an effective dimension of 10 mm square. Conductors 31 are made of aluminum, a resistivity $\rho$ of conductors is 4 $\mu\Omega$cm, a width of conductors is 1 $\mu$m, a thickness of conductors is 0.2 $\mu$m, a thickness of a dielectric 70 between conductors and a silicon substrate is 0.2 $\mu$m, and a relative dielectric constant is 4. A maximum wiring length required is about 15 mm of a diagonal length. An operation speed of a mounted electronic circuit, actually a propagation delay time of a gate circuit is 100 ps.

In the second prior art, a sectional area of a conductor is 0.2 square $\mu$m and a resistance R of a conductor is 200 $\Omega$/mm from the resistivity, the width and the thickness of conductors. Further, a capacitance of conductor is about 0.4 pF/mm from the dimensions and the relative dielectric constant. A time constant $\tau$ of conductors is 80 ps/mm$^2$ and a propagation delay time $t_{pd}$ of conductor is 40 ps/mm$^2$. The propagation delay time of conductor varies depending on a length of conductor and is 40 ps for 1 mm, 1000 ps for 5 mm, 4000 ps for 10 mm, and 9000 ps for 15 mm corresponding to the maximum wiring length. The propagation delay times $t_{pd}$ of the conductors are much greater than that of the mounted circuit which is 100 ps and, accordingly, the operation speed or performance of an electronic device is greatly deteriorated.

Figure 8:
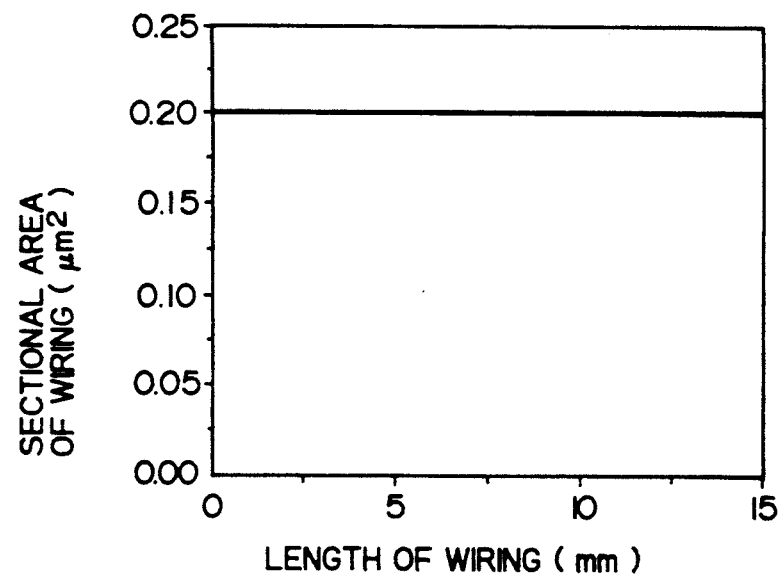
FIG. 8 is a graph showing a relation of a length and a sectional area of the wiring in the prior art shown in FIG. 7.
Figure 9:
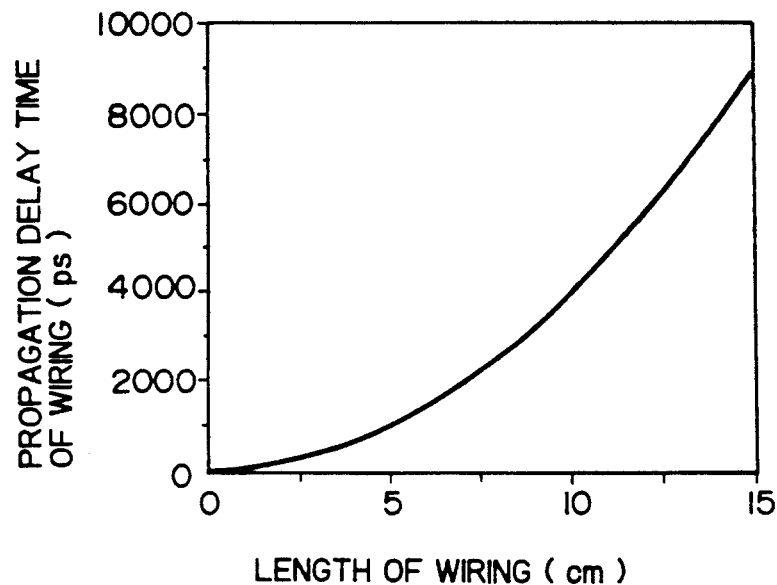
FIG. 9 is a graph showing a relation of a length and a propagation delay time of the wiring in the prior art shown in FIG. 7.

In this structure, the sectional area of a conductor is fixed regardless of the length of conductor. A relation of the length and the sectional area of the conductor is shown in FIG. 8. Further, the propagation delay time of wiring is proportional to the square of the length of wiring. A relation of the length and the propagation delay time of wiring is shown in FIG. 9.

As described above, in the prior art, the operation speed or performance of the electric device is greatly deteriorated by making wiring narrower with high density.

Consideration would be given towards a material having a smaller resistivity so as to suppress an increase of a resistance, however, there is no known material having such a considerably small resistivity as that compared with copper or aluminum that could be used. Superconductivity reduces a resistance remarkably, however, a state in which the superconductivity is formed stably is not achievable and accordingly, utilization thereof in the formation wiring of the electronic device is not practical at the present time.

FIG. 1 schematically illustrates a first embodiment of the present invention.

FIG. 1 shows a section of wiring formed on a thin film multi-layer board of an electronic device by means of the thin film technique. In FIG. 1, numerals 11 to 14 denote signal conductors extending in the Y direction and sections of which are shown, and numeral 21 to 24 denote signal conductors extending in the X direction. These signal conductors are interposed between ground layers 50 to form transmission lines. Through-holes are provided to connect conductors vertically. Wiring is in the form of transmission lines. The dimension of the multi-layer wiring board is 30 cm square and accordingly a maximum wiring length required is 60 cm equal to connect a diagonal line through lateral and longitudinal paths.

The conductors 11 and 21 of first and second layers have a width and a length of 15 $\mu$m and are made of copper. Two conductors are arranged between adjacent through-holes to form a so-called two-channel structure. A space between adjacent through-holes is 110 $\mu$m and a sectional area of a conductor is 225 square $\mu$m. A conductivity of copper is 2.5 $\mu\Omega$cm and accordingly a wiring resistance is 1.11 $\Omega$/cm. An allowable wiring resistance is 5 $\Omega$ from the relation of used electronic circuit elements and other noise and accordingly a maximum allowable wiring length is 4.5 cm. That is, if a wiring length is shorter than 4.5 cm, the circuit is operated normally without influence of wiring resistance. Accordingly, the first and second wiring layers 11 and 21 accommodate wiring having a length of 4.5 cm or less. Since the multi-layer wiring board is 30 cm square, the number of channels per wiring layer, that is, the number of positions in which wiring can be accommodated is 5454 (2$\times$30 cm/110 $\mu$m) and the first and second wiring layers accommodate 10908 channels in total.

The conductors 12 and 22 of third and fourth layers are formed into a single channel structure in which one conductor is arranged between adjacent through-holes. A width of a conductor is 35 $\mu$m, a height of a conductor is 20 $\mu$m, and material of conductor is copper. With this dimension, since a sectional area of a conductor is 700 square $\mu$m and a resistance of a conductor is 0.375 $\Omega$/cm, a maximum allowable wiring length is 14 cm and a conductor having a length of 4.5 cm to 14 cm is accommodated. Actually, conductors having a length of 4.5 cm or less and which cannot be accommodated in the first and second layers are accommodated slightly. The wiring layer can accommodate 2727 channels per layer (30 cm/110 $\mu$m) and both of the third and fourth wiring layers can accommodate 5454 channels in total.

In the conductors 13 and 23 of fifth and sixth layers, a space between through-holes is 220 $\mu$m equal to twice of that in the first to fourth wiring layers and a two-channel structure is adopted. A width, a thickness, a sectional area and a resistance of a conductor are 55 $\mu$m, 25 $\mu$m, 1375 square $\mu$m and 0.182 $\Omega$/cm, respectively, and thus a maximum allowable wiring length becomes 27.5 cm. Accordingly, conductors having a length larger than 14 cm and smaller than 27.5 cm are accommodated. This wiring layer accommodates 2727 channels per layer (2$\times$30 cm/220 $\mu$m) and 5454 channels in total can be accommodated in both of the fifth and sixth wiring layers.

In the conductors 14 and 24 of seventh and eighth layers, a single channel structure is adopted on condition of a space between through-holes of 220 $\mu$m. Since a width and a thickness of a conductor are designed to be 135 $\mu$m and 25 $\mu$m, respectively, a sectional area and a resistance of a conductor are 3375 square $\mu$m and 0.0741 $\Omega$/cm, respectively, and a maximum allowable wiring length is 67.5 cm. Accordingly, conductors having a length smaller than 67.5 cm, actually smaller than 60 cm corresponding to the maximum wiring length and larger than 27.5 cm are mainly accommodated. This wiring layer accommodates 1363 channels per layer (30 cm/220 $\mu$m) and 2726 channels in total can be accommodated in both of the seventh and eighth wiring layers.

Thus, 24542 channels in total can be obtained in the eight wiring layers of the first to eighth wiring layers.

Figure 10:
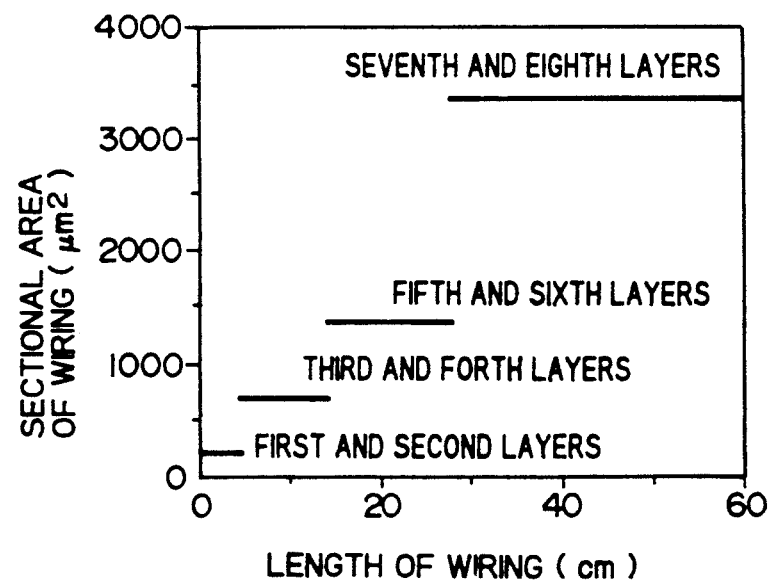
FIG. 10 is a graph showing a length and a sectional area of wiring in the first embodiment of the present invention shown in FIG. 1.
Figure 11:
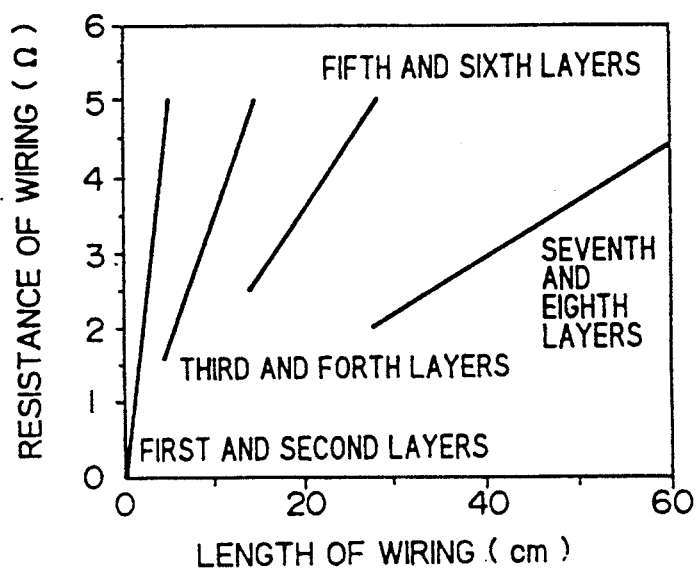
FIG. 11 is a graph showing a relation of a length and a resistance of wiring in the embodiment of the present invention.

A relation of the length and the sectional area of conductor in the first embodiment is shown in FIG. 10. It is designed that the sectional areas are different depending on the layers and the length of the conductor is substantially proportional to the sectional area thereof. Further, a relation of the length and the resistance of the conductor is shown in FIG. 11. It will be understood that resistance values of the conductors are all equal to or smaller than 5 &8 by means of the present design method and are endeavored to approach to a fixed value.

Figure 12:
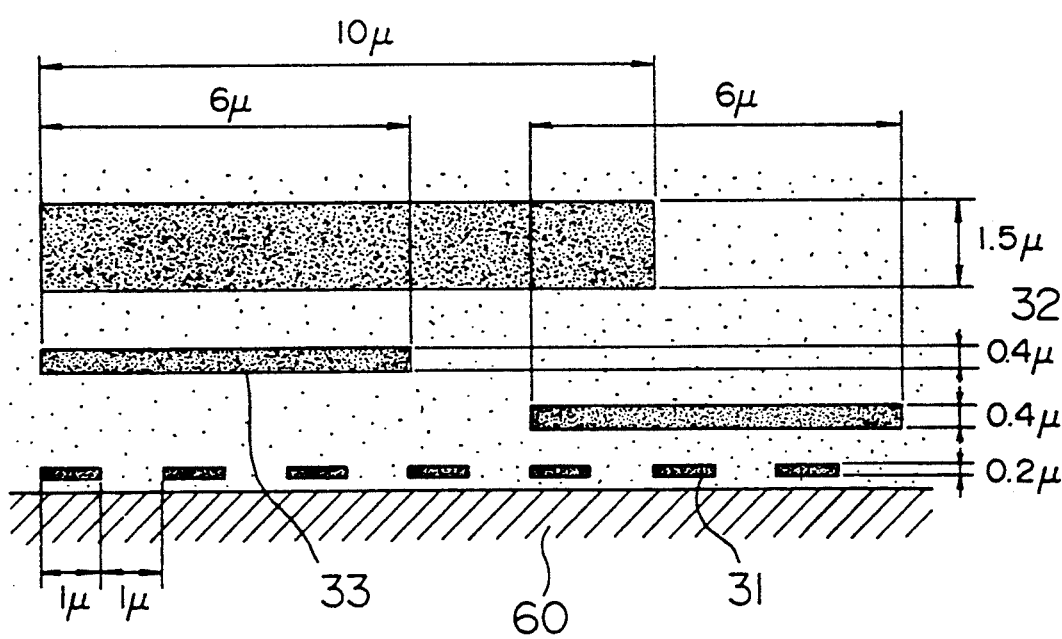
FIG. 12 is a partially sectional view schematically illustrating a semiconductor integrated circuit showing a second embodiment of the present invention.

FIG. 12 schematically illustrates a second embodiment of the present invention.

FIG. 12 shows a semiconductor integrated circuit in section, which includes a so-called zero-channel structure in which a through-hole for connecting a conductor of a different layer on a channel position of wiring can be provided. Conductors formed on a semiconductor 60 are not a transmission line and have no terminating resistance. FIG. 12 shows only conductors extending in the Y direction and sections thereof are viewed. Conductors are made of aluminum and a resistivity thereof is 4 $\mu\Omega$cm. A plane of an area of the semiconductor integrated circuit in which conductors are actually arrayed is 10 mm square. Since a delay time of a gate circuit in the semiconductor integrated circuit is 100 ps, a target is set so that a propagation delay time of wiring is smaller than 100 ps, that is, a time constant of wiring is smaller than 200 ps. Further, a maximum wiring length required is designed as about 15 mm of a diagonal length.

A conductor 31 of a first layer has a space between channels of 2 $\mu$m, a thickness of 0.2 $\mu$m, a width of 1 $\mu$m, a sectional area of 0.2 square $\mu$m and a resistance of 200 $\Omega$/mm. A thickness of a dielectric disposed under conductors is 0.2 $\mu$m and a capacitance of wiring is 0.4 pF/mm. Accordingly, a time constant $\tau$ is $\mu=80$ ps/mm$^2$ at a function of a wiring length. The propagation delay time of a conductor of 1.6 mm or less is smaller than 100 ps in this wiring layer and accordingly conductors having a length of 1.6 mm or less are accommodated. 5000 channels (10 mm/2 $\mu$m) can be accommodated in the wiring layer on the semiconductor.

A conductor 32 of a second layer has a space between channels of 8 $\mu$m, a thickness of 0.4 $\mu$m, a width of 6 $\mu$m, a sectional area of 2.4 square $\mu$m and a resistance of 17 $\Omega$/mm. A thickness of a dielectric disposed under conductors is 0.6 $\mu$m and a capacitance of wiring is 0.5 pF/mm on average. Accordingly, a time constant $\tau$ is $\tau=8$ ps/mm$^2$ at a function of a wiring length. The propagation delay time of a conductor of 5 mm or less is smaller than 100 ps in this wiring layer and accordingly conductors having a length smaller than 5 mm and mainly larger than 1.6 mm are accommodated. 1250 channels (10 mm/8 $\mu$m) can be accommodated in the wiring layer on the semiconductor.

A conductor 33 of a third layer has the same dimension as that of the second wiring layer. A capacitance of wiring is reduced to 0.35 pF/mm on average by increase of one layer of dielectric and accordingly a time constant is 5.8 ps/mm$^2$. Since the propagation delay time of a conductor of 5.8 mm or less is smaller than 100 ps in this wiring layer, conductors having a length smaller than 5.8 mm and mainly longer than 1.6 mm are accommodated. 1250 channels can be accommodated in this wiring layer on the semiconductor.

A conductor 34 of a fourth layer has a space between channels of 14 $\mu$m, a thickness of 1.5 $\mu$m, a width of 10 $\mu$m, a sectional area of 15 square $\mu$m and a resistance of 2.7 $\Omega$/mm. A thickness of a dielectric disposed under conductors is 1 $\mu$m and a capacitance of wiring is 0.3 pF/mm. Accordingly, a time constant $\tau$ is $\tau=0.8$ ps/mm$^2$ at a function of a wiring length. The propagation delay time of a conductor of 15.8 mm or less is smaller than 100 ps in this wiring layer and accordingly conductors having a length smaller than 15.8 mm and mainly larger than 5.8 mm are accommodated. Thus, conductors having a maximum length can be accommodated. 714 channels (10 mm/14 $\mu$m) can be accommodated in the wiring layer on the semiconductor.

Thus, 8214 channels in total can be accommodated in the first to fourth wiring layers.

The width and the thickness of wiring are not standardized to a single dimension to have variety by using the technique according to the present invention, so that effects of the high density wiring can be utilized while keeping the propagation delay time of wiring to 100 ps or less to thereby accommodate 8214 conductors.

Figure 13:
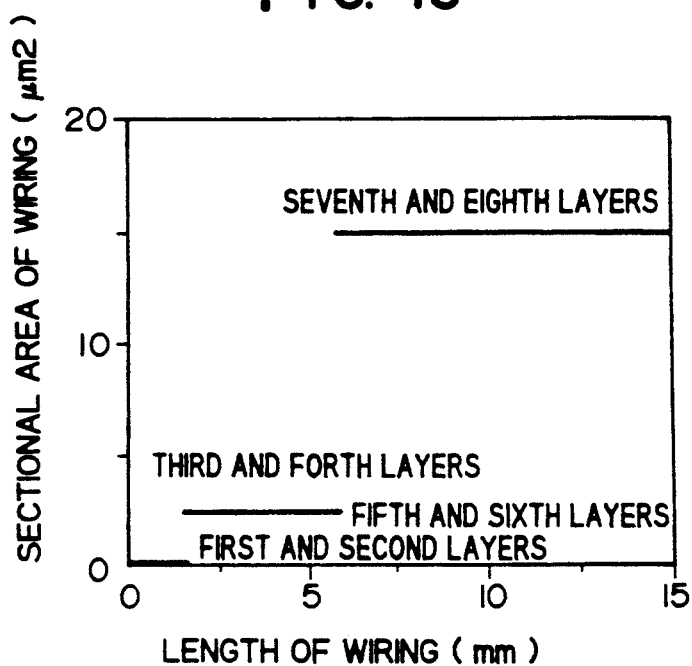
FIG. 13 is a graph showing a relation of a length and a sectional area of wiring in the second embodiment of the present invention, shown in FIG. 12.
Figure 14:
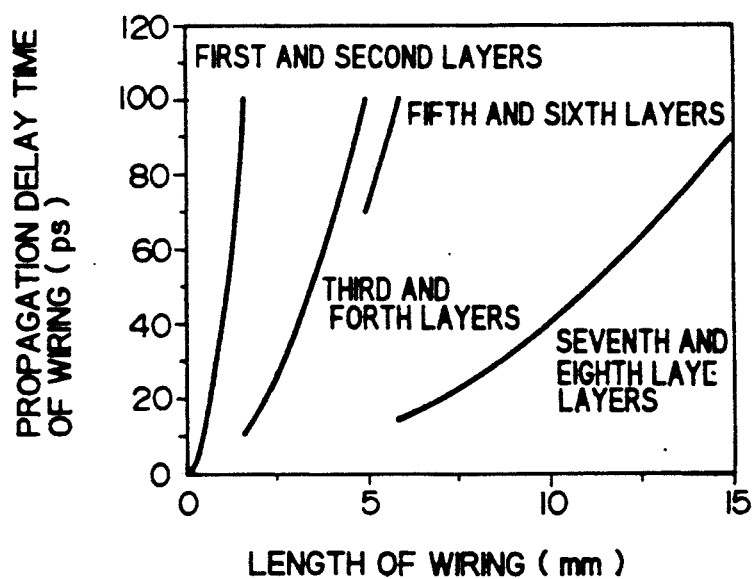
FIG. 14 is a graph showing a relation of a length and a propagation delay time of wiring in the second embodiment of the present invention, shown in FIG. 12.

A relation of the length and the sectional area of wiring in the second embodiment is shown in FIG. 13. It is designed that the sectional areas of wiring are different depending on the layers and are substantially proportional to the square of the length. Further, a relation of the length and the resistance of wiring is shown in FIG. 14. It will be understood that the propagation delay time of wiring is equal to or smaller than 100 ps by means of the present design method and is endeavored to approach to a fixed value.

As described above in detail by using the embodiments, according to the technique of the present invention, effects of the high-density wiring technique can be utilized while avoiding malfunction of an electronic device or reduction of performance thereof with respect attaining to miniaturization, increased functions and high performance of the device and thereby leading to the advancement of the electronic device.

In the first embodiment shown in FIG. 1, the minimum width of wiring can be made narrower and thinner from 55 $\mu$m to 20 $\mu$m with high density without malfunction of the electronic circuit mounted and the number of channels for conductors is increased from 14545 to 24542 for the same eight layers with the density of conductors being increased to 1.7 times for the wiring board or substrate having the same external dimension and the same number of layers.

In the second embodiment shown in FIG. 12, the propagation delay time of wiring is reduced from 9000 ps to 100 ps with improvement of 90 times by utilizing the high density wiring technique without reduction of an operation speed of the electronic device.

Thus, according to the technique of the present invention, the high density wiring technique can be utilized without malfunction of the electronic circuit and without reduction of the operation speed of the electronic device, so that miniaturization, circuit complexity, large scale formation, increased functions and high performance of the electronic device can be attained to contribute to development of the electronic industry.

In the first embodiment, it is designed so that the sectional area of wiring is substantially proportional to the length thereof, and in the second embodiment it is designed so that the sectional area of wiring is substantially proportional to the square of the length thereof. However, the essence of the present invention is that the sectional area is increased in accordance with the length of wiring, and accordingly a relation of the sectional area and the length of wiring is not limited to a value such as the first power and the second power of the length of the wiring. In the embodiments, the dimension such as the width and the thickness is varied in the different wiring layer and is identical in the same wiring layer, while conductors having different dimensions may be mixedly arranged within the same layer or the dimension of through-holes or the like within the same layer may be varied. Further, it is not necessary to adopt a layer structure if possible. A relation of the width, thickness or the like of wiring and the sectional area or the like may be selectively decided to be most effective in accordance with circumstances and demand of various actually applied products.

I claim:

1. An electronic device having high-density wiring comprising a plurality of conductors distributed with high density and each being formed to have a sectional area determined on the basis of length thereof.
    wherein ones of said plurality of conductors which have relatively longer lengths have sectional areas which are larger than those ones of said plurality of conductors of relatively shorter lengths, and
    wherein each of said plurality of conductors is formed to have one of a plurality of sectional areas, used for said plurality of conductors in said device, as determined on a basis of the relative length thereof.

2. An electronic device having high-density wiring according to claim 1, wherein an increase in the sectional area of one conductor of a wiring over that of another conductor of said wiring is in proportion to the difference in the relative lengths thereof.

3. An electronic device having high-density wiring comprising a plurality of conductors distributed with high density and each being formed to have a sectional area determined on the basis of length thereof,
    wherein ones of said plurality of conductors which have relatively longer lengths have sectional areas which are larger than those ones of said plurality of conductors of relatively shorter lengths, and
    wherein said plurality of conductors are disposed as plural groups of conductors, each group including one or more conductors having an associated predetermined range of conductor lengths, all conductors of each group are formed to have the same sectional area and the sectional areas of conductors of respectively different conductor groups are different.

4. An electronic device having high-density wiring comprising a plurality of conductors distributed with high density and each being formed to have a sectional area determined on the basis of length thereof,
    wherein ones of said plurality of conductors which have relatively longer lengths have sectional areas which are larger than those ones of said plurality of conductors of relatively shorter lengths,
    wherein said plurality of conductors are disposed as plural groups of conductors, each group includes conductors having the same sectional area and each group is associated with a predetermined range of conductor lengths, and
    wherein wirings of a predetermined length required in said device are effected through an electrical connection including conductors from one or more of said plural groups of conductors.

5. An electronic device having high-density wiring according to claim 1, wherein said plurality of conductors are provided in a multi-layer structure including a plurality of vertically stacked conductor layers, in which each conductor layer is associated with conductors having the same sectional area, and in which conductors of respectively different conductor layers have different sectional areas.

6. An electronic device having high-density wiring according to claim 1, wherein said plurality of conductors are provided in a multi-layer structure of a semiconductor integrated circuit, formed on a semiconductor substrate, including a plurality of vertically stacked conductor layers, in which each conductor layer is associated with conductors having the same sectional area, and in which conductors of respectively different conductor layers have different sectional areas.

7. An electronic device having high-density wiring according to claim 1, wherein said plurality of conductors are provided in a multi-layer wiring substrate structure including a plurality of vertically stacked conductor layers, in which each conductor layer is associated with conductors having the same sectional area, and in which conductors of respectively different conductor layers have different sectional areas.

8. An electronic device having high-density wiring according to claim 5, wherein different layers of said plurality of vertically stacked conductor layers are electrically isolated via an insulator, except at respective locations thereof where electrical interconnections between conductors of different conductor layers are to be effected.

9. An electronic device having high-density wiring according to claim 6, wherein different layers of said plurality of vertically stacked conductor layers are electrically isolated via an insulator, except at respective locations thereof where electrical interconnections between conductors of different conductor layers are to be effected.

10. An electronic device having high-density wiring according to claim 7, wherein different layers of said plurality of vertically stacked conductor layers are electrically isolated via an insulator, except at respective locations thereof where electrical interconnections between conductors of different conductor layers are to be effected.

11. An electronic device having high-density wiring according to claim 1, wherein the sectional area associated with each conductor, included in a wiring, is substantially proportional to the square of the length thereof.

12. An electronic device having high-density wiring according to claim 1, wherein the amount of increase in the sectional area of one conductor in a wiring over that of another conductor in said wiring is substantially proportional to the square of the difference in their lengths.

13. An electronic device having high-density wiring according to claim 3, wherein the amount of increase in the sectional area of a conductor of one group over that of a conductor of another group is substantially proportional to the square of the difference in their lengths.

14. An electronic device having high-density wiring according to claim 4, wherein the amount of increase in the sectional area of a conductor of one group over that of a conductor of another group is substantially proportional to the square of the difference in their lengths.

15. An electronic device having high-density wiring according to claim 5, wherein the amount of increase in the sectional area of a conductor of one group over that of a conductor of another group is substantially proportional to the square of the difference in their lengths.

16. An electronic device having high-density wiring according to claim 6, wherein the amount of increase in the sectional area of a conductor of one group over that of a conductor of another group is substantially proportional to the square of the difference in their lengths.

17. An electronic device having high-density wiring according to claim 3, wherein the amount of increase in the sectional area of a conductor of one group over that of a conductor of another group is substantially proportional to the difference in their lengths.

18. An electronic device having high-density wiring according to claim 4, wherein the amount of increase in the sectional area of a conductor of one group over that of a conductor of another group is substantially proportional to the difference in their lengths.

19. An electronic device having high-density wiring according to claim 5, wherein the amount of increase in the sectional area of a conductor of one group over that of a conductor of another group is substantially proportional to the difference in their lengths.

20. An electronic device having high-density wiring according to claim 7, wherein the amount of increase in the sectional area of a conductor of one group over that of a conductor of another group is substantially proportional to the difference in their lengths.

* * * * *